(12) United States Patent
Gauvin et al.

(10) Patent No.: US 6,255,878 B1
(45) Date of Patent: Jul. 3, 2001

(54) DUAL PATH ASYNCHRONOUS DELAY CIRCUIT

(75) Inventors: Coralyn S. Gauvin; William K. Petty; Brian K. Herbert, all of Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/307,533

(22) Filed: May 7, 1999

Related U.S. Application Data (63) Continuation-in-part of application No. 09/156,678, filed on Sep. 18, 1998, now abandoned.

(51) Int. Cl.⁷ .................................................. H03H 11/26
(52) U.S. Cl. .......................................... 327/263; 327/285
(58) Field of Search .................................... 327/166, 175, 327/176, 218, 225, 261–264, 276–278, 284, 285

(56) References Cited

U.S. PATENT DOCUMENTS

| | | | |
|---|---|---|---|
| 4,458,165 | * 7/1984 | Jackson | 327/276 |
| 4,710,653 | * 12/1987 | Yee | 327/38 |
| 4,926,115 | 5/1990 | Tarleton et al. | 324/83 |
| 4,979,190 | 12/1990 | Sager et al. | 375/106 |
| 5,111,455 | 5/1992 | Negus | 370/112 |
| 5,173,618 | * 12/1992 | Eisenstadt | 327/239 |
| 5,233,617 | * 8/1993 | Simmons et al. | 371/61 |
| 5,349,612 | 9/1994 | Guo et al. | 375/118 |
| 5,519,734 | 5/1996 | Ben-Efraim | 375/341 |
| 5,544,203 | 8/1996 | Casasanta et al. | 375/376 |
| 5,548,235 | 8/1996 | Marbot | 327/158 |
| 5,570,294 | 10/1996 | McMinn et al. | 364/481 |
| 5,638,016 | 6/1997 | Eitrheim | 327/175 |
| 5,726,595 | 3/1998 | Lin et al. | 327/155 |
| 5,777,567 | 7/1998 | Murata et al. | 341/100 |
| 5,869,992 | * 2/1999 | Sekino | 327/276 |
| 5,898,540 | * 4/1999 | Ben-Meir et al. | 365/233 |

* cited by examiner

Primary Examiner—My-Trang Nu Ton
(74) Attorney, Agent, or Firm—Fish & Richardson P.C.

(57) ABSTRACT

A precision delay circuit having two delay chains to provide equal delay periods is described. A rising edge of an input pulse signal is supplied to the first delay chain and the falling edge is supplied to the second delay chain. The resultant output signal maintains the pulse width of the input signal and pulse distortion is minimized. In another aspect, a delay circuit for generating a delayed assertion signal that does not maintain the width of the original input signal pulse and which is substantially immune to noise problems is described. An assertion edge of a resultant pulse is timed by the incoming pulse, but the de-assertion edge is timed by the delayed de-assertion edge of the incoming pulse.

14 Claims, 6 Drawing Sheets

DUAL PATH ASYNCHRONOUS DELAY CIRCUIT

This is a continuation-in-part of U.S. application Ser. No. 09/156,678 filed on Sep. 18, 1998 now abandoned.

BACKGROUND OF THE INVENTION

The invention pertains to a dual path asynchronous delay circuit for introducing a delay into a system.

In telecommunications systems, bus interface systems and the like, it is sometimes desirable to delay certain signals to permit other portions of the system to respond to signal changes. For example, a bus expander circuit may delay signals on a primary bus to permit adequate turnaround time for signals on a secondary bus.

Analog delay cells have been developed for use in electronic circuitry to delay signals. Either the current or voltage available to a device can be varied, or the capacitive loading can be varied, to introduce a variable delay. A variable delay element can thus be built using inverters or other circuit devices.

A problem concerning the production of analog delay cells is that currents for p-channel and n-channel devices cannot be exactly matched. The inherent variations in processing, and differences in temperature and voltage, may result in devices that exhibit asymmetric drive. The asymmetric drive increases or decreases the pulse width of the signal as the signal pulse travels through a chain of delay cells, resulting in distortion or loss of the signal.

Another problem is that the delay of each cell in a chain of delay cells defines the minimum pulse width of a signal required to ensure that the signal will propagate through the entire chain. If a signal pulse width is too narrow, then as the signal propagates through consecutive stages of the delay chain at some point it will not attain a voltage sufficient to produce an output. Thus, it would be beneficial to develop a delay circuit that can propagate and delay a small pulse having a pulse width that is less than or equal to the delay provided by each delay cell.

SUMMARY OF THE INVENTION

The invention pertains to a dual delay chain precision delay circuit having a first flip-flop configured to be triggered by a rising edge of an input pulse signal and a second flip-flop configured to be triggered by the falling edge of the input pulse signal. A first delay chain of delay cells has a first delay cell connected to a first output line, and a second delay chain of delay cells has a first delay cell connected to a second output line. The delay cells of the first and second delay chains produce first and second delay outputs. A delay latch is connected to the first and second delay chains and has a delay output. The delay latch is set by the first delay output signal and reset by the second delay output signal. As a result, the pulse width of the delay circuit output is equal to the pulse width of the input pulse signal.

Implementations of the invention may contain one or more of the following features. The delay cells of the first and second delay chains may be interleaved. The circuit may include a first feedback loop connected to the output of a preselected delay cell of the first delay chain and connected to a reset input of the first flip-flop. Similarly, the circuit may include a second feedback loop connected to the output of a preselected delay cell of the second delay chain and connected to a reset input of the second flip-flop. The first and second delay chains may comprise matched delay cells. A first exclusive-OR circuit having a first input may be connected to the first delay output, and a second input of the exclusive-OR circuit may be connected to the output of a delay cell that is positioned before the end of the first delay chain. In addition, a second exclusive-OR circuit may have a first input connected to the second delay output and a second input may be connected to the output of a delay cell that is positioned before the end of the second delay chain, wherein the first exclusive-OR circuit generates a signal to set the delay latch and the second exclusive-OR circuit generates a signal to reset the delay latch.

In another implementation, a method for introducing a delay for a pulse signal includes introducing a rising edge of the pulse signal to a first delay chain of a plurality of delay cells and introducing a falling edge of the pulse signal to a second delay chain of a plurality of delay cells. The rising and falling edges of the pulse signal are then propagated through the delay chains. A latch is set with the output of the first delay chain and reset with the output of the second delay chain. The result is that the pulse width of the input signal is preserved.

Implementations of the technique may include one or more of the following features. The rising edge of the input signal may clock a first flip-flop, and the falling edge of the input signal may clock a second flip-flop. A first exclusive-OR circuit may generate a signal to reset the latch.

Another aspect of the invention concerns a delay circuit for generating a delayed assertion signal. The delay circuit includes a clock toggle circuit element connected to a signal input line. The input of a delay chain of a plurality of delay cells connected in series is connected to the output of the toggle circuit element. The complement of a reset signal is connected to a first input of an AND circuit and the output of a delay cell within the delay chain is connected to a second input of the AND circuit. The output of the AND circuit is connected to a low active input of the toggle circuit element. An OR circuit has a first input connected to the signal line and a second input connected to a reset signal. A latch circuit has a first input connected to the output of the OR circuit and a second input connected to the output of the delay chain, and asserts the output signal in response to assertion of the signal input line. The latch circuit is clocked by the output of the delay chain to de-assert the output signal to produce a delayed de-assertion of the output signal. The output signal produced by the delay circuit is insensitive to the pulse width of the input signal.

A technique for implementing the delay circuit to generate a delayed de-assertion signal that is independent of the pulse width of an input signal includes feeding the input signal to a latch circuit to assert an output signal. The input signal is also provided to a toggle circuit element, and the output of the toggle circuit element propagates through a delay chain of a plurality of delay cells. The output of a delay cell positioned within the delay chain is fed-back to reset the toggle circuit element. Lastly, a generated delay chain output signal clocks the latch circuit to de-assert the delay circuit output signal.

An implementation of the technique may include the following feature. The output of the particular delay cell in the delay chain for feedback may be chosen based on the point within the delay chain at which an input pulse will survive propagation through the remainder of the delay chain.

Advantages of the invention include providing a precision delay circuit architecture in a small area of silicon that can introduce a delay of a predetermined interval. Thus, a large delay can be implemented in a small area, in contrast to using numerous delay cells connected together which take up valuable real estate on a silicon chip and which may cause other signal delay problems.

BRIEF DESCRIPTION OF THE DRAWINGS

Like reference numbers and designations in the various drawings indicate like elements.

DETAILED DESCRIPTION

Figure 1A:
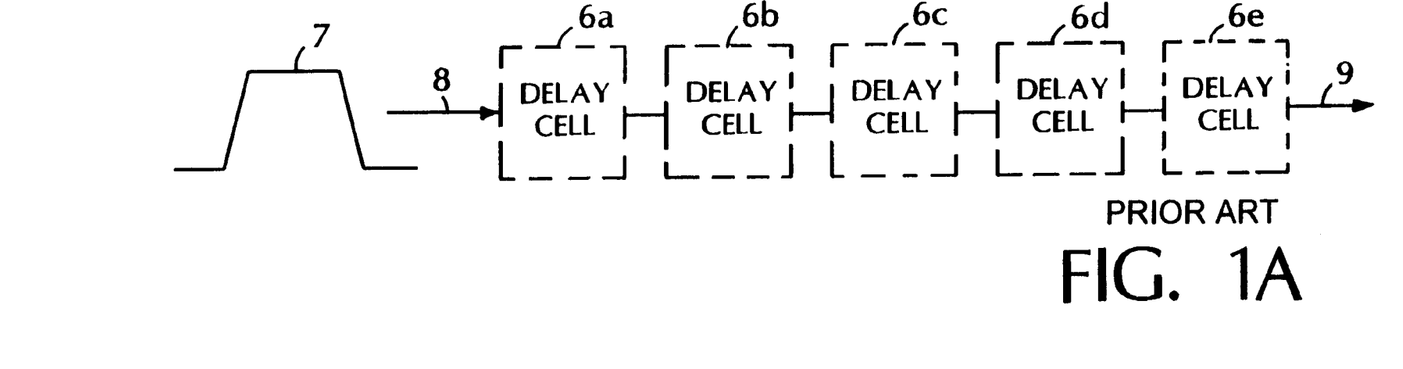
FIG. 1A illustrates a conventional delay chain.
Figure 1B:
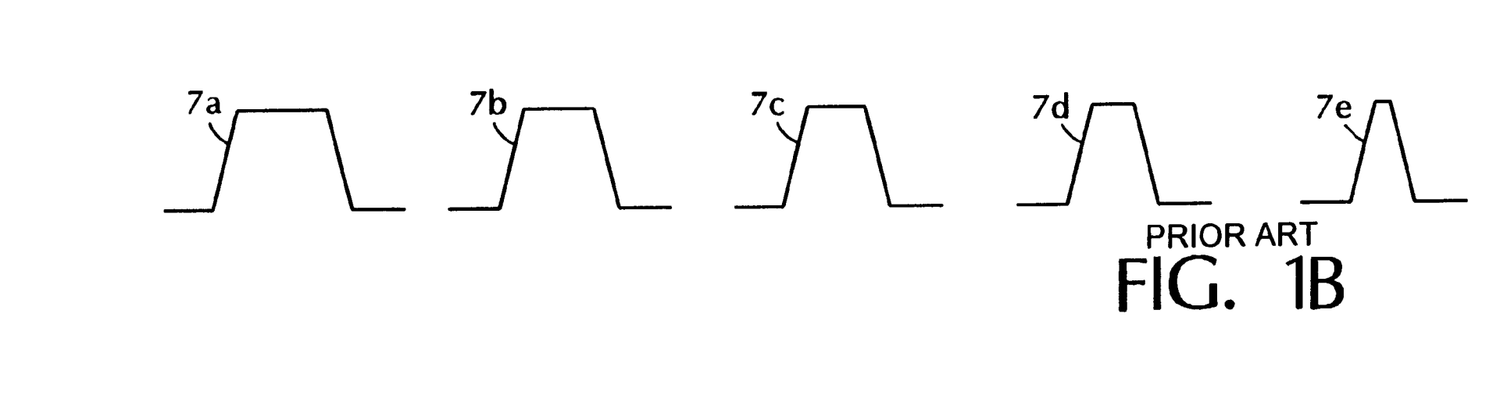
FIG. 1B illustrates distortion of an input signal as it propagates through the delay chain of FIG. 1A.

FIG. 1A illustrates a conventional delay chain 5 made up of a plurality of delay cells 6a to 6e connected in series. A signal pulse 7 is input on line 8 to delay cell 6a. FIG. 1B illustrates the distortion that may occur as the input pulse signal 7 propagates through each delay cell, shown as pulses 7a to 7e. As shown, the pulse width narrows as the pulse signal propagates, which is caused by the asymmetric drive of each of the delay cells of the chain. The resulting output signal 7e of delay cell 6e on output line 9 is a distorted signal, which is unacceptable for some circuit application Furthermore, if the delay chain 5 is longer, and thus contains more delay cells, then the input pulse would not survive propagation through the chain because the voltage level and signal width are not sufficient to ensure continued propagation. In such a case, no signal would be output from the delay chain resulting in a system failure.

Figure 2A:
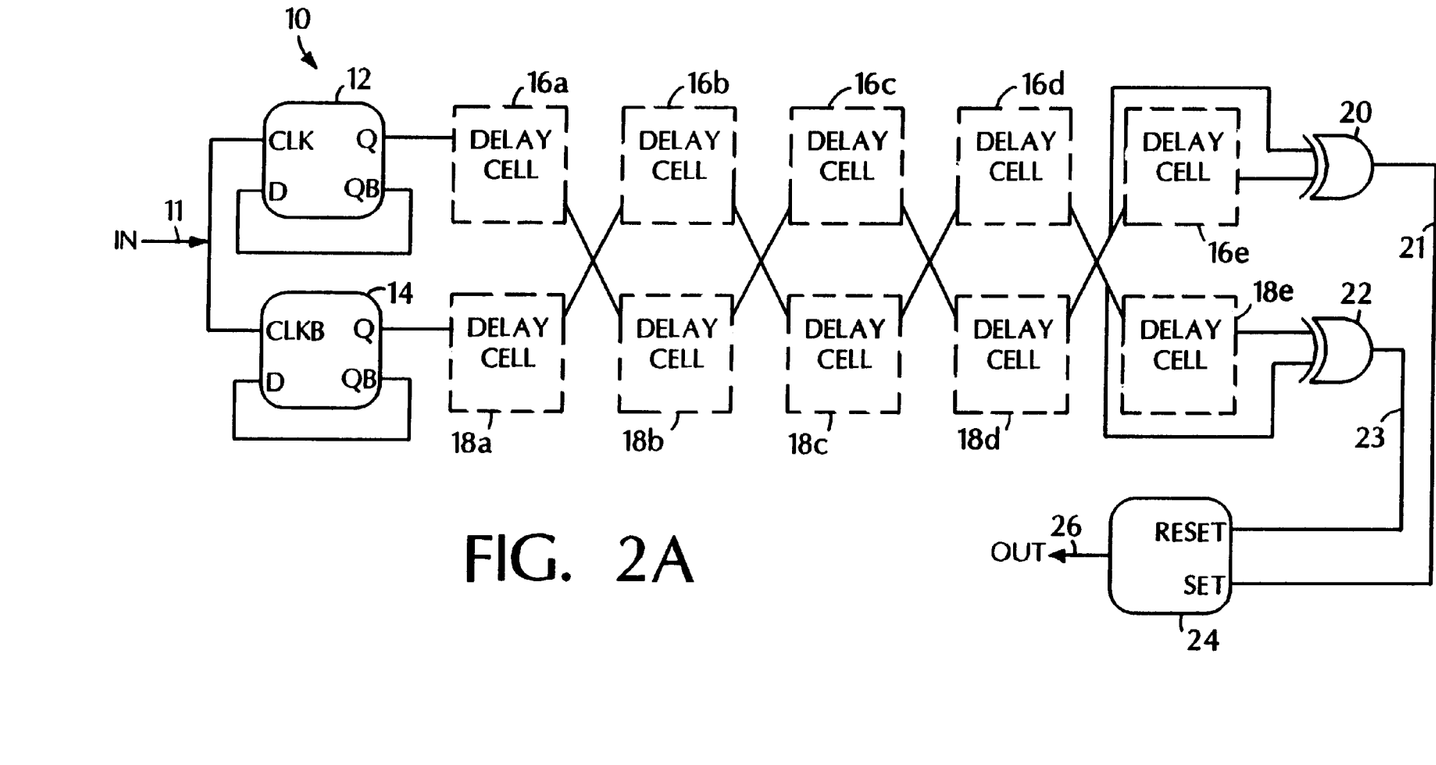
FIG. 2A illustrates an implementation of dual delay chain circuit according to the invention.

FIG. 2A illustrates an implementation of a dual delay chain circuit 10. A plurality of first non-inverting delay cells 16a–16e are interleaved with a plurality of second non-inverting delay cells 18a–18e. The system may also be designed to use inverting delay cells. The number of delay cells in a chain defines the length of the delay imparted, and connecting the two delay chains in an interleaved fashion ensures that the delay of the chains will be substantially the same. The first and second delay chains may be comprised of matching delay cells.

The dual interleaved architecture provides accurate delay of pulses and eliminates pulse distortion. Pulse distortion may occur in silicon devices, such as delay cells, due to differences in p-channel and n-channel carrier mobility. Thus, the physical interleaving of the delay cells as described tends to equally distribute the electrical properties that vary across a semiconductor device so that the delays imparted by each chain are essentially equal.

Referring to FIG. 2A, the input line 11 is connected to a first flip-flop 12 and a second flip-flop 14. The positive edge of the input pulse entering the dual delay chain circuit 10 clocks the first flip-flop 12, which starts the propagation of a first pulse through the first delay chain, 16a to 18b to 16c to 18d to 16e. The falling edge of the same input pulse causes the second flip-flop 14 to start propagation of a second pulse through the second delay chain 18a to 16b to 18c to 16d to 18e. Thus, the first chain propagates the rising edge of the pulse, while the second chain propagates the falling edge of the pulse, which eliminates the minimum pulse width requirement of a series connected delay chain such as that shown in FIG. 1A.

In the example of FIG. 2A, the first pulse eventually reaches the input of delay cell 16e and one input of Exclusive OR (XOR) circuit 20, which has the output of delay cell 16e as its other input. Since the pulse has just been input to delay cell 16e, the output of delay cell 16e is at its previous level, resulting in a high level to be on one input of XOR 20 and a low level to be on the other input of XOR 20, causing XOR 20 to output a positive value on output line 21, setting latch 24 which then drives a high value on output line 26. As the signal propagates through delay cell 16e, both inputs to XOR 20 attain the same level, resulting in a low level to be driven on output line 21 by XOR 20. Next, after a delay equal to the input pulse width, the second pulse reaches the input of delay cell 18e and one input of exclusive OR circuit 22 which has the output of delay cell 18e as its other input. Since the pulse has just been input to delay cell 18e, the output of delay cell 18e is at is previous level, resulting in a high level to be on one input of XOR 22 and a low level to be on the other input of XOR 22, causing XOR 22 to output a positive value on output line 23, resetting latch 24 which then drives a low level on output line 26. As the signal propagates through delay cell 18e, both inputs to XOR 22 attain the same level, resulting in a low level to be driven on output line 23 by XOR 22. In this manner, the input signal is re-generated on the output line 26 with the same pulse width, but after a delay caused by the travel time through the dual delay chain circuit 10 plus propagation delays induced by the associated flip-flop, XOR and latch circuit elements. Thus, due to the configuration of the circuit 10, input signal pulses of varying widths can be re-generated after a predetermined delay.

Figure 2B:
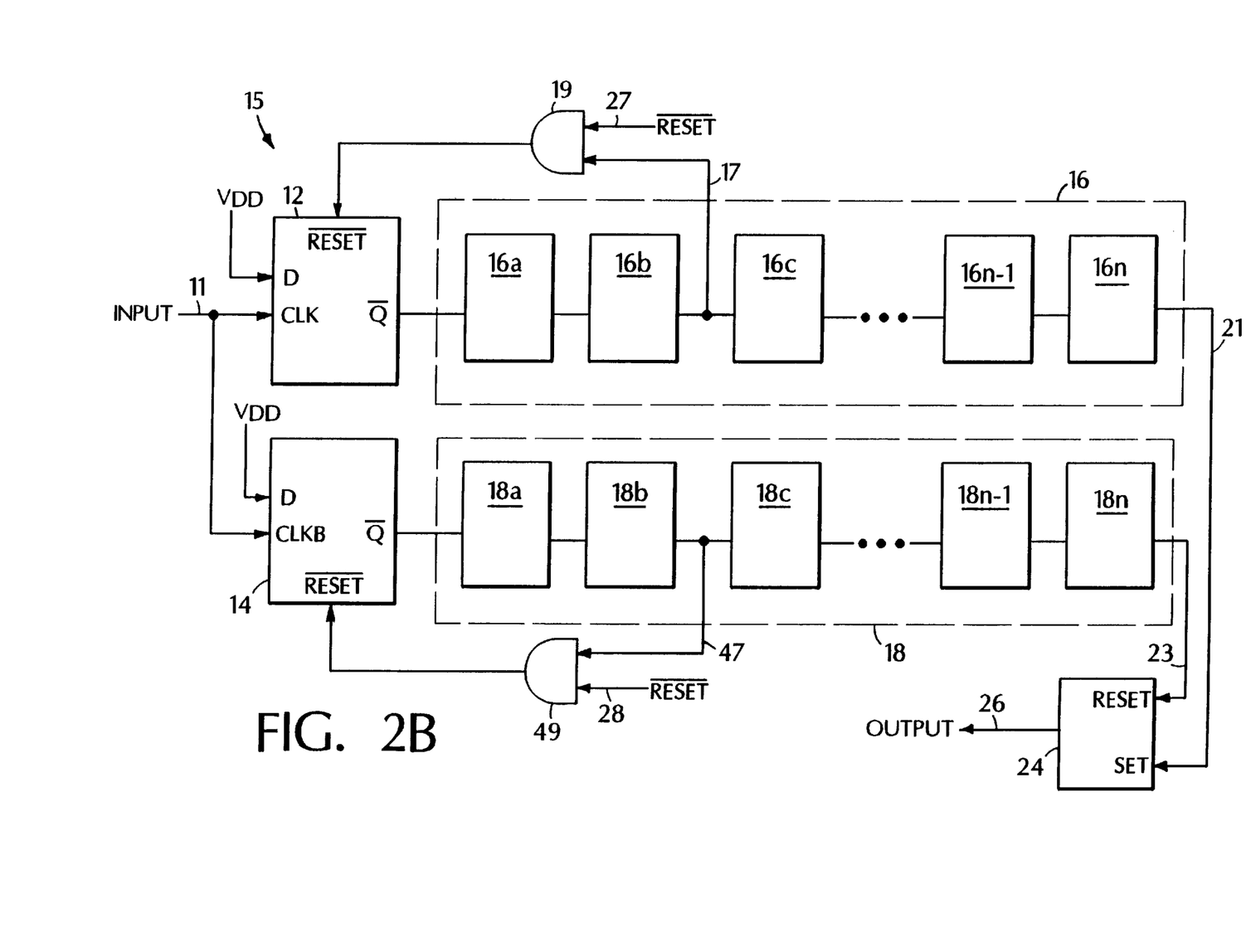
FIG. 2B illustrates another implementation of a dual delay chain circuit according to the invention.

FIG. 2B illustrates an alternate implementation of a dual delay chain circuit 15. In this implementation, two delay chains, shown as dotted line boxes 16 and 18, contain the same number of delay cells but are not interleaved. The two delay chains are tightly coupled which may be accomplished by controlling the placement of delay cells during the physical design or layout process so that the delay cells of one chain are physically close by to the delay cells of the other delay chain. Further, a software physical design macro could be written to specify connection of delay cells by minimum length interconnect lines to minimize interconnect delays between cells. Such physical design techniques help to minimize output signal errors due to noise on the input signal line which otherwise may cause an erroneous output signal.

Referring to FIG. 2B, the input line 11 is connected to a clock input of a first flip-flop 12 and a second flip-flop 14. The positive edge of the input pulse entering the dual delay chain circuit 15 clocks the first flip-flop 12, which starts the propagation of a first pulse through the first delay chain 16 of series connected delay cells 16a to 16n. The falling edge of the same input pulse causes the second flip-flop 14 to start propagation of a second pulse through the second delay chain 18 of series connected delay cells 18a to 18n. Thus, the first delay chain propagates the rising edge of the pulse, while the second delay chain propagates the falling edge of the pulse. The total number of delay cells "n" are the same for both delay chains 16 and 18 and correspond to the desired delay length. A feedback line 17 is connected between the output of a selected delay cell 16b and an AND circuit 19, which is in turn connected to the active low RESET input of the flip-flop 12. The complement of a master reset signal is fed on line 27 to the AND circuit 19. Similarly, a feedback line 47 is connected between the output of a selected delay cell 18b and an AND circuit 49, which in turn is connected to the active low RESET input of the flip-flop 14. The complement of the reset signal is fed on line 28 to the AND circuit 49.

In operation, the positive edge of an input signal pulse on line 11 clocks flip-flop 12 and a pulse eventually propagates to the input of delay cell 16n. The feedback line 17 is taken at the point in time when the pulse has travelled far enough down the delay chain 16 to guarantee that it will survive the entire length of the chain, and the feedback signal operates to reset the flip-flop 12 to clear it for the next signal input pulse. Such operation minimizes the chance of generating an erroneous output signal due to noise on the input line. The negative going edge of the same input pulse propagates down delay chain 18 in a similar manner, causing flip-flop 14 to be cleared when feedback pulse is received from AND circuit 49.

The pulse representing the positive going edge of the input signal eventually reaches the input of delay cell 16n. As the signal propagates through delay cell 16n, a high level will be driven on output line 21. Next, after a delay equal to the input pulse width, the pulse representing the negative going edge of the input pulse reaches the output of delay cell 18n. As the signal propagates through delay cell 18n, a high level is driven on output line 23. In this manner, the input signal is re-generated on the output line 26 with the same pulse width, but after a delay caused by the travel time through the dual delay chain circuit 15. Thus, input signal pulses of varying widths are re-generated by the circuit 15 after a predetermined delay.

Figure 3A:
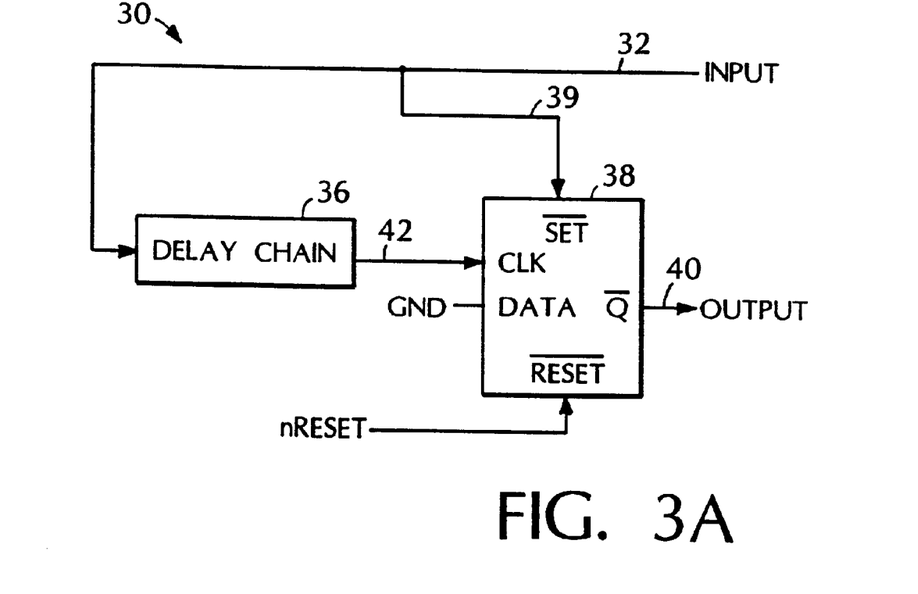
FIGS. 3A and 3B illustrate, respectively, an implementation of a delay circuit and an associated circuit timing diagram.
Figure 3B:
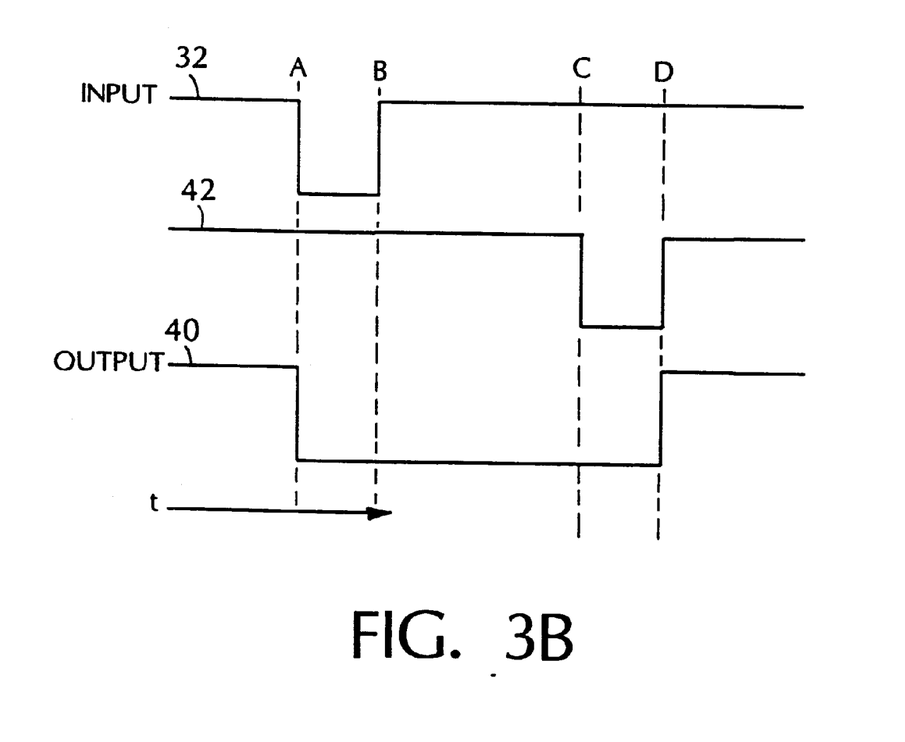

FIG. 3A illustrates another implementation of a delay circuit 30, and FIG. 3B is its associated circuit timing diagram. In this example, the circuit 30 utilizes an active low signal to extend the assertion time of a pulse. Signal extension may be required, for example, in a system utilizing two buses, wherein the two buses are operating under different timing systems, such that a signal on the first bus may need to be extended for a predetermined amount of time to allow the second bus in the system to settle.

Pulse extension is a specialized case of introducing a delay in a system wherein the width of the original signal pulse is not maintained. In particular, FIGS. 3A and 3B illustrate an implementation in which an assertion edge of a resultant pulse is timed by the assertion edge of an incoming pulse, but the de-assertion edge is timed by the delayed de-assertion edge of the incoming pulse. In the example shown in FIG. 3A, an active low input pulse (see FIG. 3B) on input line 32 is transmitted to a flip-flop 38 and to a delay chain 36, which may be a plurality of delay cells connected in series (similar to the delay chain of FIG. 1). Line 32 is connected to the active low SET input of the flip-flop, the delay chain output line 42 is connected to the flip-flop an active low clock input, a ground line is connected to the flip-flop data input, and an active low system reset line is connected to the flip-flop active low system RESET input. The active low input pulse (see "A" in FIG. 3B) sets the flip-flop 38, and causes the output signal on line 40 to go low. The active low input pulse also propagates through the delay chain 36. The rising edge of input signal pulse, shown as "B" in FIG. 3B, has no affect on the output signal on line 40 which remains low. The rising and falling edges of the input signal pulse propagate through the delay chain and emerge as a signal pulse on line 42 after a delay imparted by the delay chain 36. At time "D" the rising edge of the signal pulse on line 42 causes the output signal on line 40 to go high. It should be understood that one skilled in the art could easily modify the circuitry of FIG. 3A to operate with active high signals. For example, alternate flip-flop inputs (not shown) could be used, and the delay circuit output taken from the Q output line of the flip-flop.

Several problems may occur when the implementation of FIG. 3A is used. In particular, narrow pulses reset the flip-flop 38 but may not have a sufficient pulse width to survive propagation through the series-connected delay cells of the delay chain 36, resulting in system failure. A possible solution to this problem is to provide a filter on line 39 before the flip-flop 38 to prevent signals of insufficient pulse width to be accepted. But such a solution is unacceptable for use in many real world systems and circuit applications. In addition, noise on the input line 32 may result in an erroneous output or system failure.

Figure 4A:
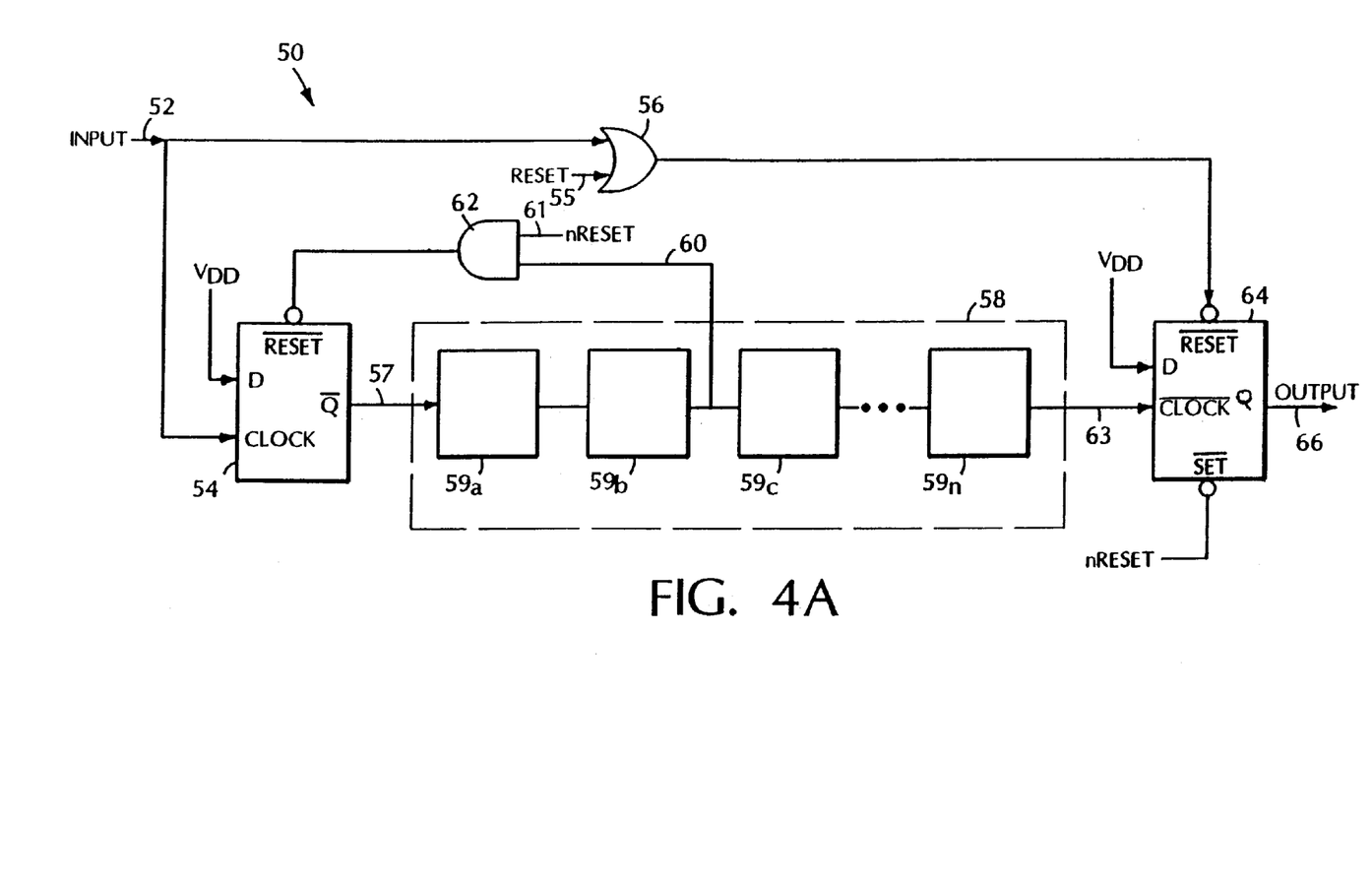
FIG. 4A illustrates an implementation of a delay circuit according to another aspect of the invention.
Figure 4B:
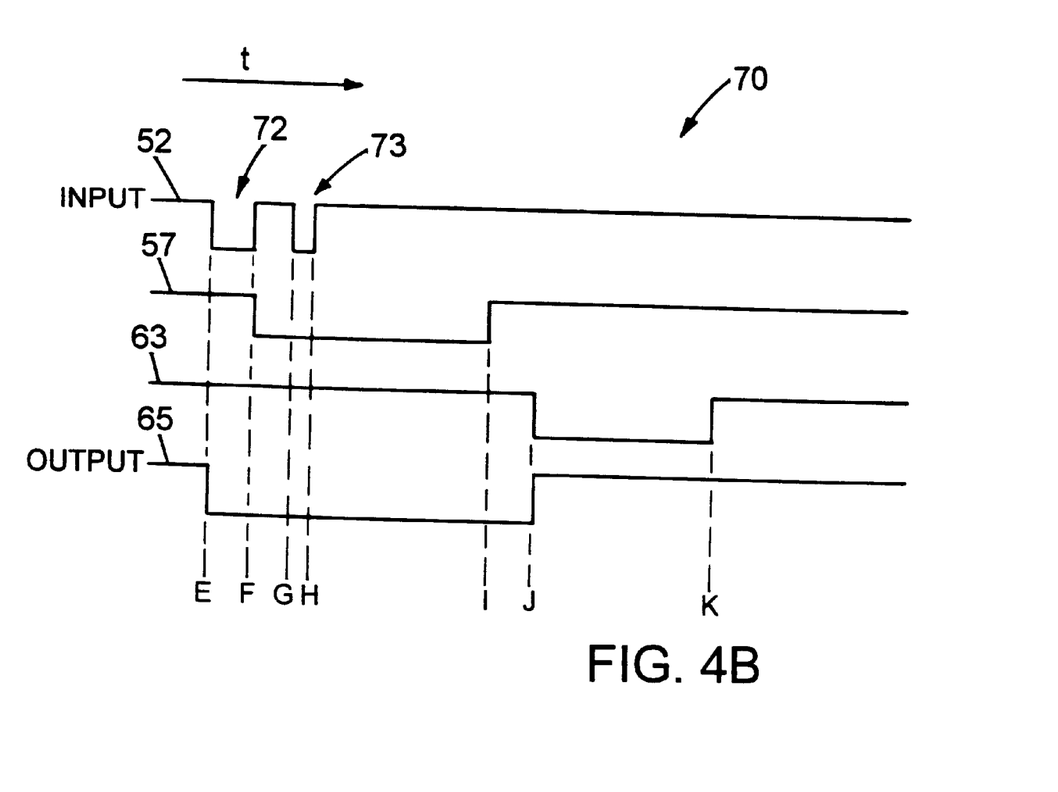
FIG. 4B is a timing diagram illustrating the operation of the circuit of FIG. 4A.

FIG. 4A and FIG. 4B illustrate an implementation of a delay circuit 50 and an associated timing diagram 70, respectively. The delay circuit 50 is not sensitive to pulse width, exhibits reduced noise sensitivity, and provides a delay signal output that does not maintain the width of the original input signal pulse. In particular, FIGS. 4A and 4B illustrate an implementation in which an assertion edge of a resultant pulse is timed by the incoming pulse, but the de-assertion edge is timed by the delayed de-assertion edge of the incoming pulse. The trigger mechanism of the circuit 50 is sensitive to a level change, and is substantially immune to problems that may otherwise occur due to multiple pulses resulting from noise in the system.

Referring to FIG. 4A, an active low input pulse is introduced on input line 52 to a toggle circuit element such as flip-flop 54 and to an OR circuit 56. The output 57 of flip-flop 54 is connected to a delay chain 58 (shown in dotted line) that includes a plurality of delay cells 59a to 59n connected in series. The total number of delay cells "n" corresponds to the desired delay length. A feedback line 60 is connected between the output of a selected delay cell in the delay chain 58 (here, the output of delay cell 59b) and an AND circuit 62, which is in turn connected to the reset input of the flip-flop 54. The output 63 of the delay chain 58 is fed to the active low clock input of a latch circuit or flip-flop 64, and the output of the OR circuit 56 is connected to the active low RESET input of the flip-flop 64. A reset signal is fed on line 55 to the OR circuit 56, and the complement of the reset signal is fed on line 61 to the AND circuit 62.

FIG. 4B is a timing diagram 70 that illustrates operation of the circuit 50 of FIG. 4A when multiple active-low pulses 72 and 73 are input on line 52. The first input pulse 72 sets the first flip-flop 54 ON, and the output signal of the second flip-flop 64 on line 65 goes low (at time "E" in FIG. 4B). Next, when the input pulse 72 goes high (at time "F" in FIG. 4B), the output signal 65 remains low, and the first flip-flop output signal on line 57 goes low. If a noise pulse 73 is input on line 52 and goes low (see "G" in FIG. 4B) and then high (see "H" in FIG. 4B), since the noise pulse 73 falls within the time period between "F" and "I" shown in FIG. 4B it will not affect the system. This is because the time duration between "F" and "I" corresponds to the delay before the feedback signal from the output of delay cell 59b reaches the reset input of the first flip-flop 54. Consequently, the noise pulse 73 has no effect on the circuit 50 because the input pulse 72 sets the first flip-flop 54 ON until it travels far enough down the delay chain 58 to guarantee that it will be large enough to propagate through the remainder of the delay cells. At that point in time (at "I" in FIG. 4B), the feedback signal is input to the AND circuit 62 with the complement of the reset signal, and then the output of the AND circuit resets the first flip-flop 54 to clear it for the next pulse. Since noise pulse 73 occurred before the first flip-flop had been reset, the flip-flop clocks and the noise pulse 73 merely joins with the input pulse. If another pulse comes in after the feedback signal resets the first flip-flop, then two pulses will propagate in the delay chain 58 at the same time, with both capable of setting the second flip-flop 64.

Referring again to FIG. 4B, at a later time "J", the delay chain output signal on line 63 goes low and the output signal 65 goes high. The delay chain output signal 63 remains low for a time equal to the delay caused by the delay chain 58, which is shown occurring at time "K".

In the example shown in FIG. 4A, the output of delay cell $59_b$ in the chain 58 is used to generate the feedback signal for the first flip-flop, but the output of another delay cell of the delay chain may be chosen. A criteria for choosing a particular delay cell output as the feedback signal is based on the point in time when the pulse has travelled far enough down the delay chain to guarantee survival through the rest of the delay chain.

The trigger mechanism in circuit 50 is sensitive to a level change in the signal rather than requiring both rising and falling transitions. Consequently, the pulse width sensitivity of the delay chain is eliminated. Further, by feeding back a signal from the delay chain to reset the first flip-flop 54, problems concerning the introduction of multiple pulses due to noise are minimized.

It should be understood that other circuit elements could be used in the delay circuit 50. For example, the circuit 64 may be implemented using an RS latch that is set by the incoming pulse and reset by the delayed pulse. It should also be understood that one skilled in the art could easily modify the circuitry of FIG. 4A to operate with active high signals.

The delay circuit 50 utilizes a delay chain 58 and circuit configuration to create a "one shot" type of delay mechanism that is insensitive to pulse width duration and substantially immune to noise problems. However, if the width of an input signal pulse must be preserved for a particular application, then the dual delay chain circuits described above with regard to FIGS. 2A and 2B provide for independent propagation of rising and falling edge information. Those configurations allow pulses having a duration less than the propagation of each delay cell to be delayed without loss.

A number of embodiments of the present invention have been described. Nevertheless, it will be understood that various modifications may be made without departing from the spirit and scope of the invention. Accordingly, other embodiments are within the scope of the following claims.

What is claimed is:

1. A precision delay circuit, comprising:
   a first flip-flop configured to be triggered by a rising edge of an input pulse signal and having a first output line;
   a second flip-flop configured to be triggered by a falling edge of the input pulse signal and having a second output line;
   a first delay chain of delay cells having a first delay cell connected to the first output line;
   a second delay chain of delay cells having a first delay cell connected to the second output line; and
   a delay latch connected to the first and second delay chains and having a delay output, wherein the delay latch is set by the first delay chain output signal and reset by the second delay chain output signal, and wherein the pulse width of the delay circuit output signal is equal to the pulse width of the input pulse signal.

2. The circuit of claim 1, wherein the delay cells of the first and second delay chains are interleaved.

3. The circuit of claim 1, further comprising a first feedback loop connected to the output of a preselected delay cell of the first delay chain and connected to a reset input of the first flip-flop.

4. The circuit of claim 1, further comprising a second feedback loop connected to the output of a preselected delay cell of the second delay chain and connected to a reset input of the second flip-flop.

5. The circuit of claim 1, wherein the first delay chain comprises matched delay cells.

6. The circuit of claim 1, wherein the second delay chain comprises matched delay cells.

7. The circuit of claim 1, further comprising:
   a first exclusive-OR circuit having a first input connected to the first delay output and having a second input connected to the output of a delay cell that is positioned before the end of the first delay chain, the first exclusive-OR circuit generating a signal to set the delay latch; and
   a second exclusive-OR circuit having a first input connected to the second delay output and having a second input connected to the output of a delay cell that is positioned before the end of the second delay chain, the second exclusive-OR circuit generating a signal to reset the delay latch.

8. A method for delaying a pulse signal, comprising:
   introducing a rising edge of the pulse signal to a first delay chain of a first plurality of delay cells;
   introducing a falling edge of the pulse signal to a second delay chain of a second plurality of delay cells;
   propagating the rising and falling edges of the pulse signal through the first and second delay chains;
   setting a latch with the output of the first delay chain; and
   resetting the latch with the output of the second delay chain, such that a pulse width of the pulse signal is maintained.

9. The method of claim 8, wherein a first flip-flop circuit introduces the rising edge of the input signal to the first delay chain, and a second flip-flop circuit introduces the falling edge of the input signal to the second delay chain.

10. The method of claim 8, further comprising:
    generating a first signal to set the latch with a first exclusive-OR circuit; and
    generating a second signal to reset the latch with a second exclusive-OR circuit.

11. A delay circuit for generating a delayed assertion signal, comprising:
    an input line;
    a toggle circuit element connected to the input line;
    a plurality of delay cells connected in series connected to an output of the toggle circuit element;
    a feedback line directly connected from an output of a delay cell to a reset input of the toggle circuit element; and
    a latch circuit having a first input connected to the input line and a second input connected to an output of the plurality of delay cells.

12. A delay circuit for generating a delayed assertion signal, comprising:

a clocked toggle circuit element connected to a signal input line and having an output;

a delay chain having a plurality of delay cells connected in series and a delay chain output, wherein the input of the delay chain is connected to the toggle circuit element output;

an AND circuit having a first input connected to a complement of a reset signal and having a second input connected to the output of a delay cell within the delay chain and having an output connected to a reset input of the toggle circuit element;

an OR circuit having a first input connected to the signal input line and a second input connected to a reset signal; and a latch circuit having a first input connected to the output of the OR circuit and a second input connected to the output of the delay chain, the latch circuit asserting the output signal in response to assertion of said signal input line, and the latch circuit being clocked by the output of the delay chain to de-assert the output signal.

13. A method for generating a delayed de-assertion signal that is independent of the pulse width of an input signal, comprising:

feeding the input signal to a latch circuit to assert an output signal;

feeding the input signal to a toggle circuit element;

transmitting the output of the toggle circuit element through a delay chain having a plurality of delay cells;

feeding back the output of a delay cell directly positioned within the delay chain to reset the toggle circuit element; and generating a delay chain output signal to clock the latch circuit to de-assert the delay circuit output signal.

14. The method of claim 13, further comprising choosing a delay cell output for feedback based on the point within the delay chain at which an input pulse will survive propagation through the remainder of the delay chain.

* * * * *